US010256866B2

(12) United States Patent
Kotake et al.

(10) Patent No.: US 10,256,866 B2
(45) Date of Patent: Apr. 9, 2019

(54) COMMUNICATION SYSTEM AND TRANSMISSION APPARATUS

(71) Applicant: Mitsubishi Electric Corporation, Tokyo (JP)

(72) Inventors: Hiroaki Kotake, Tokyo (JP); Yoshiaki Koizumi, Tokyo (JP); Takuya Mukai, Tokyo (JP); Masahiro Ishihara, Tokyo (JP)

(73) Assignee: Mitsubishi Electric Corporatio, Tokyo (JP)

( * ) Notice: Subject to any disclaimer, the term of this patent is extended or adjusted under 35 U.S.C. 154(b) by 0 days.

(21) Appl. No.: 15/508,948

(22) PCT Filed: Oct. 28, 2014

(86) PCT No.: PCT/JP2014/078572
§ 371 (c)(1),
(2) Date: Mar. 6, 2017

(87) PCT Pub. No.: WO2016/067356
PCT Pub. Date: May 6, 2016

(65) Prior Publication Data
US 2017/0288729 A1    Oct. 5, 2017

(51) Int. Cl.
*H04B 3/56* (2006.01)
*H04L 25/02* (2006.01)
(Continued)

(52) U.S. Cl.
CPC ........... *H04B 3/56* (2013.01); *H01L 27/1443* (2013.01); *H01L 31/1105* (2013.01);
(Continued)

(58) Field of Classification Search
CPC .. F24F 11/02; F25B 1/00; F25B 49/02; F25D 23/00; F25D 31/00; H01L 27/1443;
(Continued)

(56) References Cited

U.S. PATENT DOCUMENTS 5,499,510 A * 3/1996 Yoshida .................. F24F 3/065
165/205
5,642,857 A   7/1997 Totsuka et al.
(Continued)

FOREIGN PATENT DOCUMENTS

EP       1 681 776 A1    7/2006
JP      H02-274086 A    11/1990
(Continued)

OTHER PUBLICATIONS

International Search Report of the International Searching Authority dated Nov. 25, 2014 for the corresponding international application No. PCT/JP2014/078572 (and English translation).
Extended European Search Report dated Feb. 15, 2018 issued in corresponding EP patent application No. 14904926.4.

*Primary Examiner* — Shawkat M Ali
(74) *Attorney, Agent, or Firm* — Posz Law Group, PLC

(57) ABSTRACT

A transmission circuit includes a photocoupler, a conductive/non-conductive state of which is controlled in accordance with data to be transmitted to a communication device. A reception circuit includes a photocoupler, a conductive/non-conductive state of which is controlled in accordance with the conductive/non-conductive state of the transmission path. A transmission circuit includes a photocoupler, a conductive/non-conductive state of which is controlled in accordance with data to be transmitted to a communication device. A reception circuit includes a photocoupler, a conductive/non-conductive state of which is controlled in accordance with the conductive/non-conductive state of the transmission path. The photocoupler is included in the transmission path. The photocoupler and the photocoupler are in opposite conductive/non-conductive states.

9 Claims, 5 Drawing Sheets

(51) Int. Cl.
*H01L 27/144* (2006.01)
*H01L 31/11* (2006.01)
*H04B 3/54* (2006.01)

(52) U.S. Cl.
CPC .............. *H04B 3/542* (2013.01); *H04L 25/02* (2013.01); *H04B 2203/5466* (2013.01); *H04B 2203/5483* (2013.01)

(58) Field of Classification Search
CPC ....... H01L 31/1105; H04B 3/56; H04B 3/542; H04L 12/40; H04L 27/00; H04Q 9/00
USPC ................... 62/115, 175, 259.1, 331; 236/51; 375/257–260; 700/276
See application file for complete search history.

(56) References Cited

U.S. PATENT DOCUMENTS

| | | | | |
|---|---|---|---|---|
| 7,848,852 | B2* | 12/2010 | Sakae | ................... F24F 11/0086 236/51 |
| 2009/0077991 | A1* | 3/2009 | Nakajima | .............. F24F 11/006 62/259.1 |
| 2011/0167861 | A1* | 7/2011 | Yamamoto | .............. F24F 11/006 62/331 |

FOREIGN PATENT DOCUMENTS

| | | |
|---|---|---|
| JP | H04-304740 A | 10/1992 |
| JP | H08-271022 A | 10/1996 |
| JP | 3835174 B2 | 8/2006 |

* cited by examiner

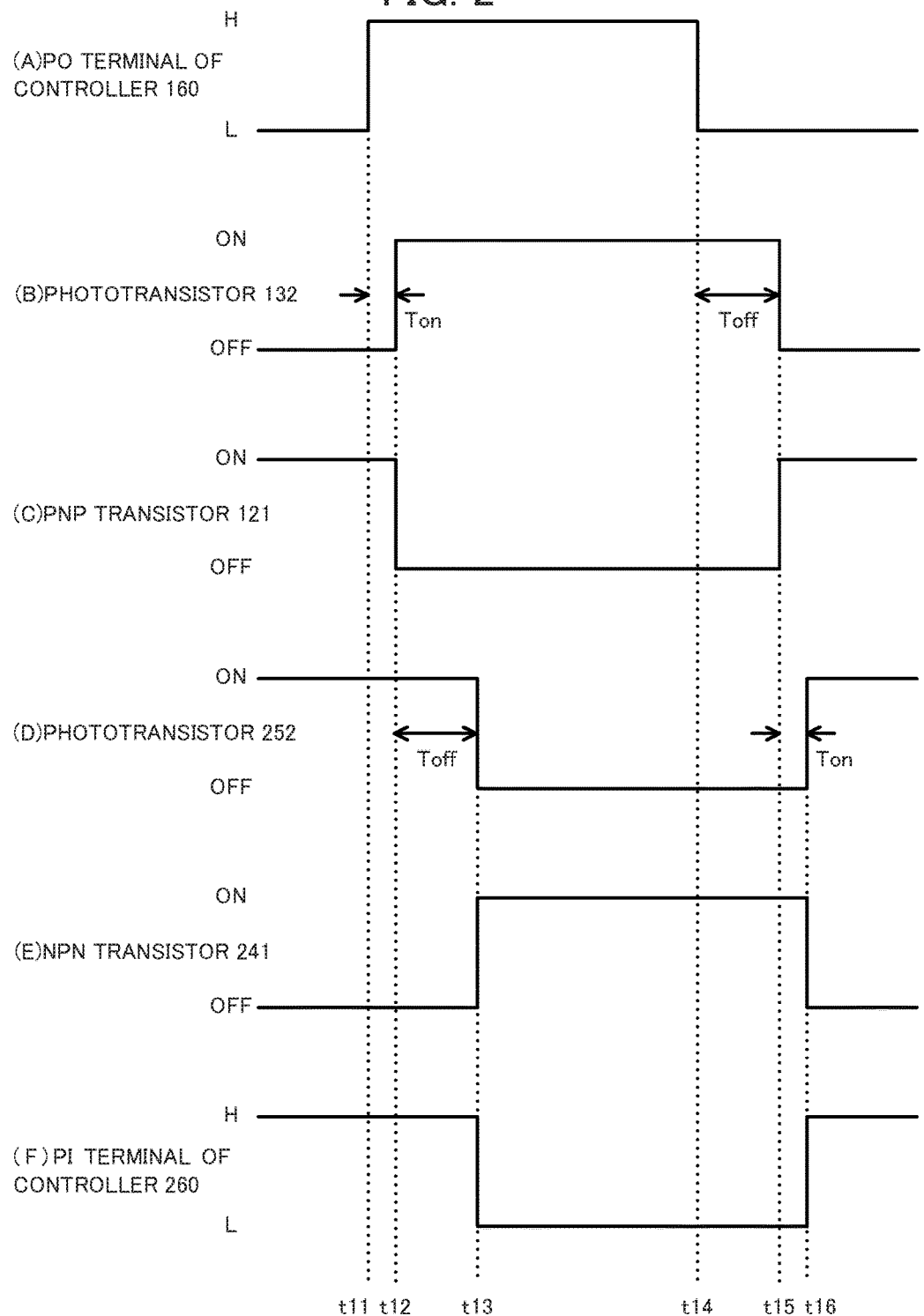

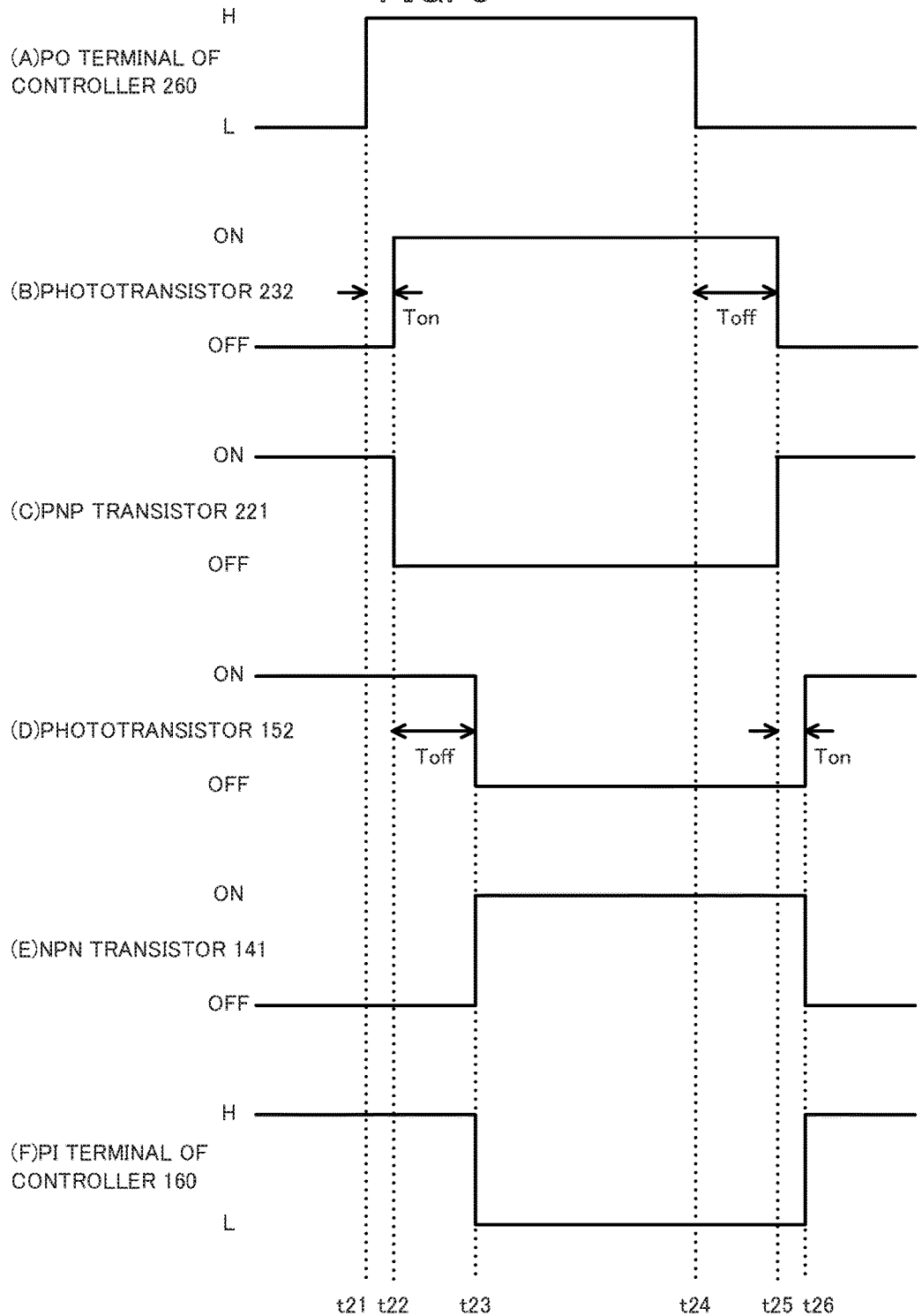

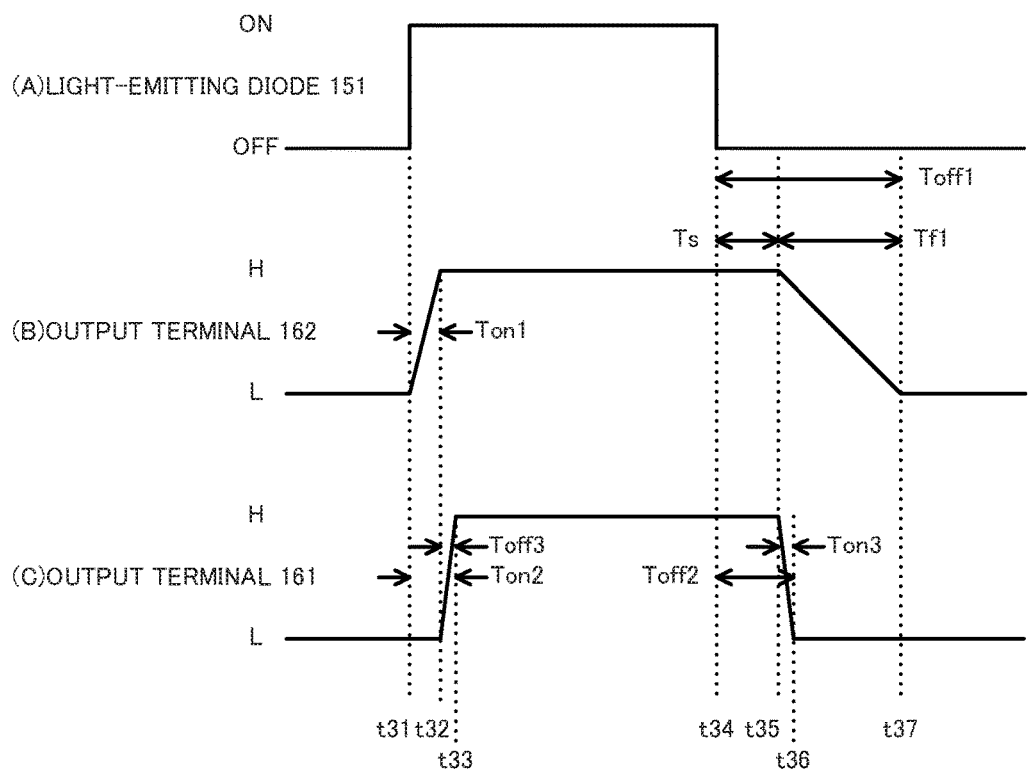

COMMUNICATION SYSTEM AND TRANSMISSION APPARATUS

CROSS REFERENCE TO RELATED APPLICATION

This application is a U.S. national stage application of International Patent Application No. PCT/JP2014/078572 filed on Oct. 28, 2014, the content of which is incorporated herein by reference.

TECHNICAL FIELD

The present disclosure relates to a communication system for communication by serial communication using photocouplers, and a transmission device thereof.

BACKGROUND

A communication system for communication by serial communication using photocouplers is known. As an example, Patent Literature 1 discloses a multi-split air conditioner including indoor units and an outdoor unit that communicate with one another by serial communication through a transmission path including a signal line and a reference line. In the multi-split air conditioner disclosed in Patent Literature 1, a transmission phototransistor included in a transmission photocoupler and a reception light-emitting diode included in a reception photocoupler are both provided on the transmission path.

Thus, in the multi-split air conditioner disclosed in Patent Literature 1, the reception photocoupler transitions from an OFF state (non-conductive state) to an ON state (conductive state) in response to a state transition of the transmission photocoupler from an OFF state to an ON state, whereas the reception photocoupler transitions from the ON state to the OFF state in response to a state transition of the transmission photocoupler from the ON state to the OFF state. Here, a delay time from a state transition of a transmission light-emitting diode included in the transmission photocoupler to a state transition of a reception phototransistor included in the reception photocoupler is longer than or equal to the sum of a switching time period for the transmission photocoupler and a switching time period for the reception photocoupler.

PATENT LITERATURE

Patent Literature 1: Unexamined Japanese Patent Application Kokai Publication No. H08-271022

For both the transmission photocoupler and the reception photocoupler, however, the switching time period (turn-off time) required for transition from the ON state to the OFF state is longer than the switching time period (turn-on time) required for transition from the OFF state to the ON state. The multi-split air conditioner disclosed in Patent Literature 1 thus experiences a very long delay time for transition of the transmission photocoupler from the ON state to the OFF state, which results in an inability to increase communication speed. A technique of implementing high-speed serial communication using photocouplers is thus desired.

SUMMARY

The present disclosure has been made to solve the problems as above, and an objective of the present disclosure is to provide a communication system and transmission device for implementing high-speed serial communication using photocouplers.

To achieve the foregoing objective, a communication system according to the present disclosure includes a communication system including a first communication device and a second communication device that are configured to perform serial communication with each other. Either one device of the first communication device and the second communication device includes a direct-current power source. The first communication device and the second communication device are connected to each other via a communication line that allows electric current supplied from the direct-current power source to flow therethrough from the one device to another device and via a reference line that allows the electric current passed through the communication line to flow therethrough from the other device to the one device.

The first communication device includes a first transmission circuit including a first transmission photocoupler. A conductive/non-conductive state of the first transmission photocoupler is controlled in accordance with data to be transmitted to the second communication device. The first transmission circuit is configured to control a conductive/non-conductive state of a transmission path including the communication line and the reference line in accordance with the conductive/non-conductive state of the first transmission photocoupler. The first communication device further includes a first reception circuit including a first reception photocoupler, a conductive/non-conductive state of the first reception photocoupler being controlled in accordance with the conductive/non-conductive state of the transmission path. The first reception circuit is configured to detect the conductive/non-conductive state of the first reception photocoupler, thereby receiving data transmitted by the second communication device.

The second communication device includes a second transmission circuit including a second transmission photocoupler. A conductive/non-conductive state of the second transmission photocoupler is controlled in accordance with data to be transmitted to the first communication device. The second transmission circuit is configured to control the conductive/non-conductive state of the transmission path in accordance with the conductive/non-conductive state of the second transmission photocoupler. The second communication device further includes a second reception circuit including a second reception photocoupler. A conductive/non-conductive state of the second reception photocoupler is controlled in accordance with the conductive/non-conductive state of the transmission path. The second reception circuit is configured to detect the conductive/non-conductive state of the second reception photocoupler, thereby receiving data transmitted by the first communication device.

The second reception photocoupler is included in the transmission path, and the first transmission photocoupler and the second reception photocoupler are in opposite conductive/non-conductive states.

In the present disclosure, the second reception photocoupler is included in the transmission path, and the first transmission photocoupler and the second reception photocoupler are in opposite conductive/non-conductive states. Accordingly, the present disclosure enables high-speed serial communication using photocouplers.

BRIEF DESCRIPTION OF DRAWINGS

FIG. 2 is a timing chart illustrating timing of state transition for each element in data transmission from a communication device 100 to a communication device 200;

FIG. 3 is a timing chart illustrating timing of state transition for each element in data transmission from the communication device 200 to the communication device 100;

FIG. 5 is a timing chart illustrating timing of state transition for a light-emitting diode 151 and timing of level transition for each output terminal.

DETAILED DESCRIPTION

Embodiments (Configuration of Communication System 1000)

Figure 1:
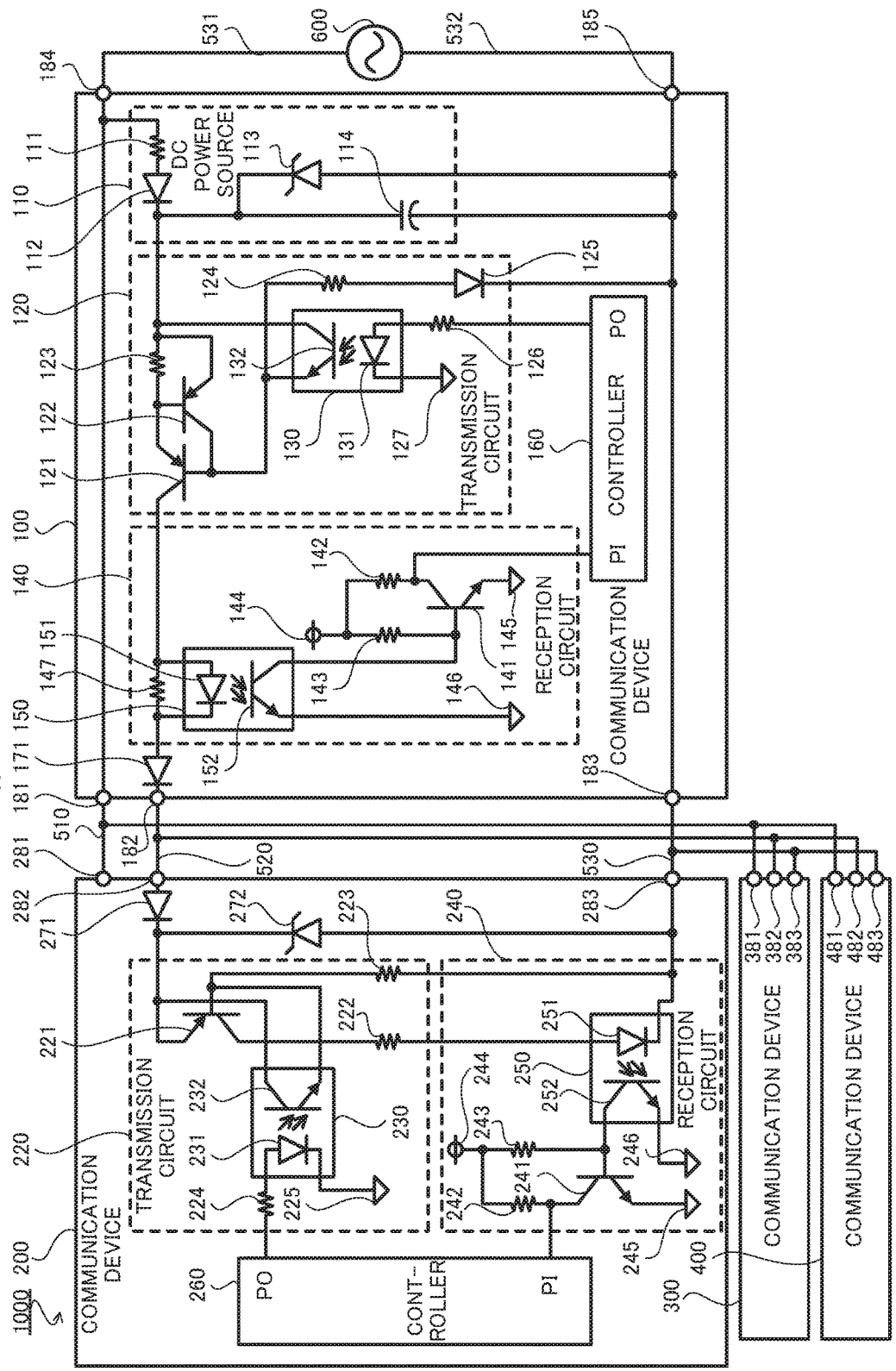
FIG. 1 is a configuration diagram of a communication system according to one embodiment of the present disclosure.

Referring initially to FIG. 1, a configuration of a communication system 1000 according to an embodiment of the present disclosure is described. As illustrated in FIG. 1, the communication system 1000 includes a communication device 100, a communication device 200, a communication device 300, and a communication device 400. In the present embodiment, but not by way of limitation, the communication system 1000 is an air conditioning system, the communication device 100 is an outdoor unit, and the communication device 200, the communication device 300, and the communication device 400 are indoor units.

The communication device 100 is connected, via a power line 510, a communication line 520, and a reference line 530, to each of the communication device 200, the communication device 300, and the communication device 400. The communication device 100 is connected to an alternating-current (AC) power source 600 through a power line 531 and a reference line 532. The AC power source 600 supplies AC power and is, for example, a commercial power source for providing an output voltage of 200 V. A connection relationship among components is hereinafter described in detail.

The communication device 100 includes a terminal 181, a terminal 182, a terminal 183, a terminal 184, and a terminal 185. The communication device 200 includes a terminal 281, a terminal 282, and a terminal 283. The communication device 300 includes a terminal 381, a terminal 382, and a terminal 383. The communication device 400 includes a terminal 481, a terminal 482, and a terminal 483. The terminal 181 is connected through the power line 510 to each of the terminal 281, the terminal 381, and the terminal 481. The terminal 182 is connected through the communication line 520 to each of the terminal 282, the terminal 382, and the terminal 482. The terminal 183 is connected through the reference line 530 to each of the terminal 283, the terminal 383, and the terminal 483. Thus the communication device 200, the communication device 300, and the communication device 400 are connected in parallel to the communication device 100 via each line of the power line 510, the communication line 520, and the reference line 530.

The terminal 184 is connected to one end (terminal to which an L-phased voltage is applied) of the AC power source 600 through the power line 531. The terminal 185 is connected to the other end (terminal to which an N-phased voltage is applied) of the AC power source 600 through the reference line 532. That is, the communication device 100 receives supply of AC power from the AC power source 600 via the terminal 184 and the terminal 185. The communication device 200 receives supply of AC power from the AC power source 600 via the terminal 281 and the terminal 283. The communication device 300 receives supply of AC power from the AC power source 600 via the terminal 381 and the terminal 383. The communication device 400 receives supply of AC power from the AC power source 600 via the terminal 481 and the terminal 483.

The power line 510 is an electric line for applying the L-phased voltage from the communication device 100 to the communication device 200, the communication device 300, and the communication device 400. The communication line 520 is an electric line for passing communication current from the communication device 100 to the communication device 200, the communication device 300, and the communication device 400. The reference line 530 is an electric line for returning the communication current from the communication device 200, the communication device 300, and the communication device 400 back to the communication device 100, and also for applying the N-phased voltage from the communication device 100 to the communication device 200, the communication device 300, and the communication device 400. The power line 510, the communication line 520, and the reference line 530 are grouped into a three-core cable. Simplified laying installation can be expected with use of the three-core cable.

A data transmission technique in serial communication with communication current is described hereinafter. The communication current flows along a transmission path from the communication device 100, through the communication line 520, through a communication device that is a communicating party, and through the reference line 530, back to the communication device 100. The communication current is also called loop current since the current starts from and then returns to the communication device 100. Here, the communicating party is at least one of the communication device 200, the communication device 300, or the communication device 400. When the number of communicating parties is two or more, the communication current is split to flow through the communicating parties and then combined to flow back to the communication device 100. The magnitude of the communication current is adjusted in accordance with the number of communicating parties.

The data transmitted by the serial communication is represented in binary with a combination of "1" and "0". When the data is transmitted from the communication device 100 to the communicating party, the communication device 100 passes or blocks the communication current for every sampling period based on the transmission data. For example, the communication device 100 passes the communication current when "1" is to be transmitted, but does not pass the communication current when "0" is to be transmitted. In this case, a flow of communication current is indication that "1" is transmitted, while no flow of communication current is indication that "0" is transmitted.

The communicating party then determines the presence or absence of the communication current for every sampling period, and recognizes, as data transmitted by the communication device 100, the binary data associated with a pattern of the presence or absence of the communication current. The logic of "0" and "1" can be reversed as appropriate. The flow conditions of the communication current on the transmission path is referred to as a conductive state on the communication path, and the no-flow conditions of the communication current on the transmission path is referred to as a non-conductive state on the transmission path. The conductive/non-conductive state of the transmission path means that the conduction state on the transmission path is either of the conductive state or the non-conductive state. The conductive state is sometimes referred to as an ON state, and the non-conductive state is sometimes referred to as an OFF state.

When the data is transmitted from the communicating party to the communication device 100, the communicating party passes or blocks the communication current for every sampling period based on the transmission data. The communication device 100 then determines the presence or absence of the communication current for every sampling period, and recognizes, as data transmitted by the communicating party, the binary data associated with the pattern of the presence or absence of the communication current.

A configuration of the communication device 100 is described hereinafter. As illustrated in FIG. 1, the communication device 100 includes a direct-current (DC) power source 110, a transmission circuit 120, a reception circuit 140, a controller 160, and a diode 171.

The DC power source 110 supplies communication current for use in serial communication. The DC power source 110 converts the AC power supplied by the AC power source 600 via the terminal 184 and the terminal 185 into DC power. The DC power source 110 produces communication voltage Vc (V) on the basis of the electric potential of the reference line 530. The DC power source 110 is a half-wave rectifier circuit that includes a resistance 111, a diode 112, an electrolytic capacitor 114, and a voltage regulator diode 113.

The resistance 111 is a resistance for producing DC voltage. The resistance 111 has one end connected to the terminal 184. The resistance 111 has the other end connected to an anode of the diode 112. The diode 112 is a rectifier element for passing electric current only in a direction from an anode to a cathode. The cathode of the diode 112 is connected to a cathode of the voltage regulator diode 113, a positive terminal of the electrolytic capacitor 114, an emitter of a positive-negative-positive (PNP) transistor 122, one end of a resistance 123, and a collector of a phototransistor 132.

The voltage regulator diode 113 is a diode for causing substantially no reverse current to flow when the reverse voltage applied between the anode and the cathode is less than the breakdown voltage, but causing the reverse current to suddenly flow when the reverse voltage is equal to or greater than the breakdown voltage. The voltage (breakdown voltage) across the voltage regulator diode 113 is Vc (V). The anode of the voltage regulator diode 113 is connected to a negative terminal of the electrolytic capacitor 114, a cathode of a diode 125, and the terminal 183 and the terminal 185. The electrolytic capacitor 114 is a polarized capacitor for temporarily storing supplied energy.

The transmission circuit 120 is a circuit for data transmission by control of communication current flowing along the transmission path. Specifically, the transmission circuit 120 prevents the communication current from flowing along the transmission path while a parallel output (PO) terminal of the controller 160 is at a high (H) level, and allows the communication current to flow along the transmission path while the PO terminal of the controller 160 is at a low (L) level. Here, for example, the H level is 5 V and the L level is 0 V. The transmission circuit 120 includes a PNP transistor 121, the PNP transistor 122, the resistance 123, a resistance 124, the diode 125, and a photocoupler 130.

The PNP transistor 121 is a switching element having a current path (emitter-collector path) provided on the transmission path. The PNP transistor 121 is controlled to be in a conductive/non-conductive state that is opposite to that of the phototransistor 132. The emitter of the PNP transistor 121 is connected to the base of the PNP transistor 122 and the other end of the resistance 123. The collector of the PNP transistor 121 is connected to one end of a resistance 147 and an anode of a light-emitting diode 151. The base of the PNP transistor 121 is connected to the collector of the PNP transistor 122, one end of the resistance 124, and an emitter of the phototransistor 132.

The PNP transistor 122 cooperates with the resistance 123 to restrict the upper limit of the communication current flowing along the transmission path. The resistance 123 is a current restricting resistance provided on the transmission path. When the communication current supplied by the DC power source 110 causes the voltage between the emitter and the base of the PNP transistor 122 (voltage across the resistance 123) to exceed a saturation voltage (e.g., 0.6 V), the PNP transistor 122 transitions to the ON state. Thus, current flows through the resistance 124, resulting in less current flowing through the current path of the PNP transistor 121. This means that the upper limit of the communication current flowing through the communication line 520 is limited by the resistance value of the resistance 123. As such, the PNP transistor 122 and the resistance 123 serve to protect the circuit elements (e.g., PNP transistor 121, photocoupler 150) of the communication device 100.

The resistance 124 is a base resistance for restricting base current flowing through the PNP transistor 121. The resistance 124 is also a load resistance for restricting current flowing through the phototransistor 132. The diode 125 is a rectifier element for passing current only in a direction from the anode to the cathode. The resistance 126 restricts current flowing through a light-emitting diode 131. The resistance 126 has one end connected to an anode of the light-emitting diode 131 and the other end connected to the PO terminal of the controller 160. A ground terminal 127 is a grounded terminal to which the ground potential is applied.

The photocoupler 130 is an element for providing mutual electrical isolation between two circuits. The photocoupler 130 includes the light-emitting diode 131 and the phototransistor 132. In the photocoupler 130, primary-side current flows through the light-emitting diode 131, and then secondary-side current flows along the current path of the phototransistor 132. The current flowing through the light-emitting diode 131 is hereinafter referred to as primary-side current as appropriate, and the current flowing through the current path of the phototransistor 132 is hereinafter referred to as secondary-side current as appropriate. In addition, the voltage applied between the anode of the light-emitting diode 131 and the cathode of the light-emitting diode 131 is referred to as primary-side voltage, and the voltage applied between the emitter of the phototransistor 132 and the collector of the phototransistor 132 is referred to as secondary-side voltage.

When the voltage value of the primary-side voltage is equal to or greater than a threshold, the light-emitting diode 131 allows the primary-side current to flow, and emits light having an intensity associated with the current value of the primary-side current. The cathode of the light-emitting diode 131 is connected to the ground terminal 127. The phototransistor 132 causes the secondary-side current, which is associated with the secondary-side voltage and the intensity of light emitted by the light-emitting diode 131, to flow from the collector to the emitter.

An operation of the transmission circuit 120 is briefly described hereinafter. When the PO terminal of the controller 160 is at the H level, current flows via the resistance 126 to the light-emitting diode 131. This flow of current causes the photocoupler 130 to be in the ON state, and then the current supplied by the DC power source 110 flows via the phototransistor 132, the resistance 124, and the diode 125 into the reference line 530. Here, the emitter-collector voltage of the phototransistor 132 in the ON state does not exceed the emitter-base saturation voltage (e.g., approximately 0.6 V) of the PNP transistor 121, which causes the PNP transistor 121 to be in the OFF state, and thus the communication current does not flow along the transmission path.

On the other hand, when the PO terminal of the controller 160 is at the L level, current stops flowing through the light-emitting diode 131. This causes the photocoupler 130 to be in the OFF state, and the base current of the PNP transistor 121 flows via the resistance 124 and the diode 125 into the reference line 530. Thus the PNP transistor 121 transitions to the ON state and the communication current flows along the transmission path.

The reception circuit 140 is a circuit for receiving data by monitoring of the communication current flowing along the transmission path. Specifically, the reception circuit 140 causes a parallel input (PI) terminal of the controller 160 to be at the H level while the communication current flows along the transmission path, and causes the PI terminal of the controller 160 to be at the L level while no communication current flows along the transmission path. The reception circuit 140 includes a negative-positive-negative (NPN) transistor 141, a resistance 142, a resistance 143, a power source terminal 144, a ground terminal 145, a ground terminal 146, a resistance 147, and the photocoupler 150.

The NPN transistor 141 is provided for reducing the turn-off time of the photocoupler 150. The emitter of the NPN transistor 141 is connected to the ground terminal 145. The collector of the NPN transistor 141 is connected to one end of the resistance 142 and the PI terminal of the controller 160. The base of the NPN transistor 141 is connected to one end of the resistance 143 and the collector of the phototransistor 152. The resistance 142 is a resistance for pulling up the level of the PI terminal of the controller 160 to the H level. The other end of the resistance 142 is connected to the other end of the resistance 143 and the power source terminal 144.

The resistance 143 is a base resistance for restricting base current of the NPN transistor 141. The resistance 143 is also a load resistance for restricting current flowing through the phototransistor 152. The power source terminal 144 is a terminal connected to an unillustrated power source (power source, other than the DC power source 110, included in the communication device 100, and as an example, a power source for operation of the controller 160). The electric potential of the power source terminal 144 is at the H level (e.g., 5 V). The ground terminal 145 is a grounded terminal to which the ground potential is applied. The ground terminal 146 is a grounded terminal to which the ground potential is applied. The ground terminal 145 and the ground terminal 146 can be considered to be connected to each other.

The resistance 147 is a threshold resistance of the light-emitting diode 151. That is, when the communication current is minute and the voltage across the resistance 147 is less than the forward voltage of the light-emitting diode 151, all the communication current flows not through the light-emitting diode 151 but through the resistance 147. In contrast, when the communication current is large and the voltage across the resistance 147 is equal to or greater than the forward voltage of the light-emitting diode 151, the communication current also flows through the light-emitting diode 151. The other end of the resistance 147 is connected to the cathode of the light-emitting diode 151 and the anode of the diode 171.

The photocoupler 150 is basically similar in structure to the photocoupler 130. The photocoupler 150 includes the light-emitting diode 151 and the phototransistor 152. In the photocoupler 150, primary-side current flows through the light-emitting diode 151 and then secondary-side current flows along the current path of the phototransistor 152.

An operation of the reception circuit 140 is briefly described hereinafter. When the communication current flows along the transmission path, current flows through the light-emitting diode 151, and then the photocoupler 150 transitions to the ON state. This allows current to flow from the power source terminal 144 via the resistance 143 and the phototransistor 152 to the ground terminal 146. Thus the NPN transistor 141 transitions to the OFF state and current stops flowing through the resistance 142, which causes the PI terminal of the controller 160 to be at the H level.

Conversely, when no communication current flows along the transmission path, no current flows in the light-emitting diode 151, and thus the photocoupler 150 transitions to the OFF state. This causes no current flow in the phototransistor 152 and then the NPN transistor 141 transitions to the ON state. Thus current flows through the resistance 142, which causes the PI terminal of the controller 160 to be at the L level. When a photocoupler 230 is in the ON state, minute communication current flows along the transmission path. However, when the communication current flowing along the transmission path is minute, a voltage drop at the resistance 147 is small and thus no current flows through the light-emitting diode 151. That is, when the communication current is minute, the photocoupler 150 transitions to the OFF state. The condition that the communication current is minute is considered similarly as the condition that no communication current flows.

The controller 160 controls the photocoupler 130 to transmit data. The controller 160 also receives data based on the state of the photocoupler 150. The controller 160 includes the PO terminal for outputting H-level or L-level voltage and the PI terminal for receiving the H-level or the L-level voltage. The controller 160 causes the level of voltage applied to the PO terminal to switch between the H level and the L level in accordance with transmission data. The controller 160 also determines whether the voltage applied to the PI terminal is at the H level or at the L level. The controller 160 may include a digital input/output port.

The diode 171 is a rectifier element for passing current only in a direction from the anode to the cathode. The diode 171 serves to block reverse current that may otherwise flow along the transmission path due to miswiring or the like. The cathode of the diode 171 is connected to the terminal 182.

The communication device 200 includes a transmission circuit 220, a reception circuit 240, a controller 260, a diode 271, and a voltage regulator diode 272.

The transmission circuit 220 is a circuit for data transmission by control of communication current flowing along the transmission path. Specifically, the transmission circuit 220 prevents the communication current from flowing along the transmission path while the PO terminal of the controller 260 is at the H level, and allows the communication current to flow along the transmission path while the PO terminal of the controller 260 is at the L level. The transmission circuit 220 includes a PNP transistor 221, a resistance 222, a resistance 223, a resistance 224, a ground terminal 225, and the photocoupler 230.

The PNP transistor 221 is a switching element having a current path provided on the transmission path. The PNP transistor 221 is controlled to be in a conductive/non-conductive state that is opposite to that of the phototransistor 232. The emitter of the PNP transistor 221 is connected to a collector of the phototransistor 232 and a cathode of the diode 271. The collector of the PNP transistor 221 is connected to one end of the resistance 222. The base of the PNP transistor 221 is connected to one end of the resistance 223 and the emitter of the phototransistor 232.

The resistance 222 is a resistance for restricting the communication current flowing along the transmission path. The other end of the resistance 222 is connected to the anode of the light-emitting diode 251. The resistance 223 is a base resistance for restricting base current flowing through the PNP transistor 221. The resistance 223 is also a load resistance for restricting current flowing through the phototransistor 232. Here, the resistance value of the resistance 223 is sufficiently greater than the resistance value of the resistance 222. Thus the current value of the communication current flowing through the resistance 223 when the photocoupler 230 transitions to the ON state becomes sufficiently smaller than the current value of the communication current flowing through the resistance 222 when the photocoupler 230 transitions to the OFF state. Such a configuration causes the photocoupler 150 to be in the OFF state when the photocoupler 230 transitions to the ON state, and causes the photocoupler 150 to be in the ON state when the photocoupler 230 transitions to the OFF state. The other end of the resistance 223 is connected to the cathode of the light-emitting diode 251, the anode of the voltage regulator diode 272, and the terminal 282.

The resistance 224 is a resistance for restricting current flowing through the light-emitting diode 231. That is, the resistance 224 serves to protect the circuit elements (e.g., PNP transistor 221, photocoupler 250) of the communication device 200. The resistance 224 has one end connected to the anode of the light-emitting diode 231. The resistance 224 has the other end connected to the PO terminal of the controller 260. The ground terminal 225 is a grounded terminal to which the ground potential is applied. The ground terminal 225 is connected to the cathode of the light-emitting diode 231.

The photocoupler 230 is basically similar in structure to the photocoupler 130. The photocoupler 230 includes a light-emitting diode 231 and a phototransistor 232. In the photocoupler 230, primary-side current flows through the light-emitting diode 231 and then secondary-side current flows along the current path of the phototransistor 232.

An operation of the transmission circuit 220 is briefly described hereinafter. When the PO terminal of the controller 260 is at the H level, current flows via the resistance 224 to the light-emitting diode 231. This flow of current causes the photocoupler 230 to be in the ON state, and then the communication current supplied through the communication line 520 flows via the phototransistor 232 and the resistance 223 into the reference line 530. However, the resistance value of the resistance 223 is high and thus the communication current flowing therethrough is insignificant. Here, the emitter-collector voltage at the ON state of the phototransistor 232 does not exceed the emitter-base saturation voltage (e.g., approximately 0.6 V) of the PNP transistor 221, which causes the PNP transistor 221 to be in the OFF state, and thus substantially no communication current flows along the transmission path.

On the other hand, when the PO terminal of the controller 260 is at the L level, no current flows through the light-emitting diode 231. This causes the photocoupler 230 to be in the OFF state, and the base current of the PNP transistor 221 flows via the resistance 223 into the reference line 530. Thus the PNP transistor 221 transitions to the ON state and the communication current flows along the transmission path.

The reception circuit 240 is a circuit for receiving data by monitoring of the communication current flowing along the transmission path. Specifically, the reception circuit 240 causes the PI terminal of the controller 260 to be at the H level while the communication current flows along the transmission path, and causes the PI terminal of the controller 260 to be at the L level while no communication current flows along the transmission path. The reception circuit 240 includes an NPN transistor 241, a resistance 242, a resistance 243, a power source terminal 244, a ground terminal 245, a ground terminal 246, and a photocoupler 250.

The NPN transistor 241 is provided for reducing the turn-off time of the photocoupler 250. The emitter of the NPN transistor 241 is connected to the ground terminal 245. The collector of the NPN transistor 241 is connected to one end of the resistance 242 and the PI terminal of the controller 260. The base of the NPN transistor 241 is connected to one end of the resistance 243 and the collector of the phototransistor 252. The resistance 242 is a resistance for pulling up the level of the PI terminal of the controller 260 to the H level. The other end of the resistance 242 is connected to the other end of the resistance 243 and the power source terminal 244.

The resistance 243 is a base resistance for restricting base current of the NPN transistor 241. The resistance 243 is also a load resistance for restricting current flowing through the phototransistor 252. The power source terminal 244 is a terminal connected to an unillustrated power source (power source included in the communication device 200, and as an example, a power source for operation of the controller 260). The electric potential of the power source terminal 244 is at the H level. The ground terminal 245 is a grounded terminal to which the ground potential is applied. The ground terminal 246 is a grounded terminal to which the ground potential is applied. The ground terminal 245 and the ground terminal 246 can be considered to be connected to each other.

The photocoupler 250 is basically similar in structure to the photocoupler 230. The photocoupler 250 includes a light-emitting diode 251 and a phototransistor 252. In the photocoupler 250, primary-side current flows through the light-emitting diode 251, and then secondary-side current flows along the current path of the phototransistor 252.

An operation of the reception circuit 240 is briefly described hereinafter. When the communication current flows along the transmission path, current flows in the light-emitting diode 251, and then the photocoupler 250 transitions to the ON state. This allows current to flow from the power source terminal 244 via the resistance 243 and the phototransistor 252 to the ground terminal 246. Thus the NPN transistor 241 transitions to the OFF state and no current flows through the resistance 242, which causes the PI terminal of the controller 260 to be at the H level.

Conversely, when no communication current flows along the transmission path, no current flows in the light-emitting diode 251, and then the photocoupler 250 transitions to the OFF state. This causes no current flow in the phototransistor 252 and then the NPN transistor 241 transitions to the ON state. Thus current flows through the resistance 242, which causes the PI terminal of the controller 260 to be at the L level.

The controller 260 controls the photocoupler 230 to transmit data. The controller 260 also receives data based on the state of the photocoupler 250. The controller 260 includes the PO terminal for outputting H-level or L-level voltage and the PI terminal for receiving H-level or L-level voltage. The controller 260 switches, between the H level and the L level, the level of voltage applied to the PO terminal in accordance with transmission data. The controller 260 also determines whether the voltage applied to the PI terminal is at the H level or at the L level. The controller 260 may include a digital input/output port.

The diode 271 is a rectifier element for passing electric current only in a direction from the anode to the cathode. The diode 271 serves to block reverse current that may otherwise flow along the transmission path due to miswiring or the like. The voltage regulator diode 272 is a diode for causing substantially no reverse current to flow when the reverse voltage applied between the anode and the cathode is less than the breakdown voltage, but causing the reverse current to suddenly flow when the reverse voltage is equal to or greater than the breakdown voltage. The voltage regulator diode 272 serves to protect the circuit elements (e.g., PNP transistor 221, photocoupler 230, and photocoupler 250) of the communication device 200.

The communication device 300 and the communication device 400 are each similar in structure to the communication device 200. That is, the communication device 300 and the communication device 400 each communicate with the communication device 100 via the communication line 520 and the reference line 530.

In the present embodiment, a photocoupler is used to prevent application of high voltage to a secondary circuit including the controller 160 or a secondary circuit including the controller 260 due to, for example, miswiring of the power line 510, the communication line 520, and the reference line 530. Specifically, the secondary circuit including the controller 160 is isolated from the power line 510, the communication line 520, and the reference line 530 by the photocoupler 130 and the photocoupler 150, and the secondary circuit including the controller 260 is isolated from the power line 510, the communication line 520, and the reference line 530 by the photocoupler 230 and the photocoupler 250.

The photocoupler typically has a longer switching time period (turn-off time) required from transition from the OFF state to the ON state than the switching time period (turn-on time) required for transition from the ON state to the OFF state. The longer switching time period indicates a slow switching speed. The higher voltage-tolerant photocoupler increases the switching time period of the photocoupler. For example, the high-voltage tolerant photocoupler that can withstand applied voltage of 300 V or more exhibits the turn-on time of the order of a few μs to several tens of μs and the turn-off time of the order of several hundreds of μs.

In the present embodiment, the characteristic of being high-voltage tolerant for the photocoupler 130 and the photocoupler 230 is optional. However, the photocoupler 150 and the photocoupler 250 need to be high-voltage tolerant. To facilitate understanding, the following description assumes that the photocoupler 130, the photocoupler 150, the photocoupler 230, and the photocoupler 250 are all high-voltage tolerant and have the same property. Here, for both the photocouplers, the turn-on time is designated by Ton and the turn-off time is designated by Toff. Toff is longer than Ton.

The delay time of elements (e.g., switching time period of PNP transistor 121, NPN transistor 141, PNP transistor 221, NPN transistor 241) other than photocouplers is negligibly smaller than the delay time of the photocouplers. Thus the delay time of the elements other than the photocouplers is described as being zero unless otherwise specified.

In the present embodiment, the photocoupler 130, the photocoupler 150, the photocoupler 230, and the photocoupler 250 all have small collector current, and the collector-emitter voltage during the ON state is smaller than the emitter-base saturation voltage of the PNP transistor 121, NPN transistor 141, PNP transistor 221, and NPN transistor 241.

(Operation of Communication System 1000)

Operations of the communication device 100 and the communication device 200 in communication between the communication device 100 and the communication device 200 by serial communication via the communication line 520 and the reference line 530 is described hereinafter. First, an operation for data transmission from the communication device 100 to the communication device 200 is described.

FIG. 2 is a timing chart illustrating timing of state transition for each element at the data transmission from the communication device 100 to the communication device 200. Section (A) of FIG. 2 is a timing chart illustrating timing of level transition of the PO terminal of the controller 160. The PO terminal of the controller 160 is at either the H level or the L level. Section (B) of FIG. 2 is a timing chart illustrating timing of state transition of the phototransistor 132. The phototransistor 132 is in either the ON state or the OFF state. Section (C) of FIG. 2 is a timing chart illustrating timing of state transition of the PNP transistor 121. The PNP transistor 121 is in either the ON state (conductive state on the transmission path) or the OFF state (non-conductive state on the transmission path).

Section (D) of FIG. 2 is a timing chart illustrating timing of state transition of the phototransistor 252. The phototransistor 252 is in either the ON state or the OFF state. Section (E) of FIG. 2 is a timing chart illustrating state transition of the NPN transistor 241. The NPN transistor 241 is in either the ON state or the OFF state. Section (F) of FIG. 2 is a timing chart illustrating timing of level transition of the PI terminal of the controller 260. The PI terminal of the controller 260 is at either the H level or the L level.

An example is described as to the output level of the PO terminal of the controller 160 in which the output level is at the L level until t11, at the H level from t11 to t14, and at the L level from t14. In data transmission from the communication device 100 to the communication device 200, the output level of the PO terminal of the controller 260 remains at the L level so that the controller 160 can control the conductive/non-conductive state of the transmission path.

Until t11, the L-level signal is output from the PO terminal of the controller 160, and thus voltage equal to or greater than a threshold is not applied between the anode and cathode of the light-emitting diode 131. This does not permit the primary-side current to flow in the light-emitting diode 131, and thus the secondary-side current is not permitted to flow in the phototransistor 132. Thus the base current of the PNP transistor 121 flows from the DC power source 110 via the resistance 124 to the reference line 530. Accordingly, the PNP transistor 121 is in the ON state and the communication current flows through the communication line 520.

The communication current flows in the light-emitting diode 251 until t11, and thus the secondary-side current flows along the current path of the phototransistor 252. This causes the secondary-side current to flow from the power source terminal 244 via the resistance 243 and the phototransistor 252 to the ground terminal 246. Thus not enough base current flows in the NPN transistor 241 and the NPN transistor 241 is in the OFF state. This causes the PI terminal of the controller 260 to be at the H level. In this manner, until t11, the L-level signal output from the PO terminal of the controller 160 is supplied as the H-level signal to the PI terminal of the controller 260.

At t11, the output level of the PO terminal of the controller 160 is at the H level, and thus the primary-side current flows via the resistance 126 in the light-emitting diode 131. However, the time Ton from when the primary-side current flows in the light-emitting diode 131 to when the secondary-side current flows in the phototransistor 132 is required. At a point of time t11, therefore, secondary-side current stops flowing along the current path of the phototransistor 132 and the phototransistor 132 remains in the OFF state.

At t12 at which the time Ton has elapsed from t11, the phototransistor 132 is turned on and the secondary-side current flows in the phototransistor 132. As such, at t12, not enough base current flows in the PNP transistor 121 and then the PNP transistor 121 transitions to the OFF state. That is, when the time t12 arrives, communication current stops flowing through the communication line 520.

In addition, at t12, communication current stops flowing in the light-emitting diode 251. However, the time Toff from when communication current stops flowing in the light-emitting diode 251 to when secondary-side current stops flowing in the phototransistor 252 is required. At a point of time t12, therefore, the phototransistor 252 remains in the ON state. Thus the NPN transistor 241 remains in the OFF state and the PI terminal of the controller 260 is at the H level.

At t13 at which the time Toff has elapsed from t12, secondary-side current stops flowing in the phototransistor 252 and thus the phototransistor 252 is turned off. Accordingly, at t13, the base current of the NPN transistor 241 flows from the power source terminal 244 via the resistance 243 to the ground terminal 245, and then the NPN transistor 241 is turned on. That is, the H-level signal output from the PO terminal of the controller 160 at t11 is supplied as the L-level signal to the PI terminal of the controller 260 at t13. As such, the delay time taken from when the PO terminal of the controller 160 transitions from the L level to the H level to when the PI terminal of the controller 260 transitions from the H level to the L level is Ton+Toff.

Then at t14, the output level of the PO terminal of the controller 160 transitions to the L level and thus primary-side current stop flowing in the light-emitting diode 131. However, the time Toff from when primary-side current stops flowing in the light-emitting diode 131 to when secondary-side current stops flowing in the phototransistor 132 is required. At a point of time t14, therefore, the secondary-side current still flows in the phototransistor 132 and the phototransistor 132 remains in the ON state.

At t15 at which the time Toff has elapsed from t14, secondary-side current stops flowing along the current path of the phototransistor 132 and thus the phototransistor 132 is turned off. Thus at t15, the base current of the PNP transistor 121 flows from the DC power source 110 via the resistance 124 to the reference line 530. Accordingly, the PNP transistor 121 transitions to the ON state and then the communication current flows through the communication line 520.

At t15, the communication current flows in the light-emitting diode 251. However, the time Ton from when the communication current flows in the light-emitting diode 251 to when the secondary-side current flows in the phototransistor 252 is required. At a point of time t15, therefore, no flow of secondary-side current still remains in the phototransistor 252 and the phototransistor 252 also still remains in the OFF state. At a point of time t15, therefore, the NPN transistor 241 remains in the ON state and the L-level signal is supplied to the PI terminal of the controller 260.

At t16 at which the time Ton has elapsed from t15, the secondary-side current flows in the phototransistor 252 and thus the phototransistor 252 is turned on. Thus at t16, the PI terminal of the controller 260 transitions to the H level. As such, the delay time taken from when the PO terminal of the controller 160 transitions from the H level to the L level to when the PI terminal of the controller 260 transitions from the H level to the L level is Toff+Ton.

Next, an operation for data transmission from the communication device 200 to the communication device 100 is described. The operation for data transmission from the communication device 200 to the communication device 100 is basically similar to the operation for data transmission from the communication device 100 to the communication device 200.

FIG. 3 is a timing chart illustrating state transition for each element in data transmission from the communication device 200 to the communication device 100. Section (A) of FIG. 3 is a timing chart illustrating timing of level transition of the PO terminal of the controller 260. The PO terminal of the controller 260 is at either the H level or the L level. Section (B) of FIG. 3 is a timing chart illustrating timing of state transition of the phototransistor 232. The phototransistor 232 is in either the ON state or OFF state. Section (C) of FIG. 3 is a timing chart illustrating state transition of the PNP transistor 221. The PNP transistor 221 is in either the ON state (conductive state on the transmission path) or the OFF state (non-conductive state on the transmission path).

Section (D) of FIG. 3 is a timing chart illustrating timing of state transition of the phototransistor 152. The phototransistor 152 is in either the ON state or the OFF state. Section (E) of FIG. 3 is a timing chart illustrating timing of state transition of the NPN transistor 141. The NPN transistor 141 is in either the ON state or the OFF state. Section (F) of FIG. 3 is a timing chart illustrating timing of level transition of the PI terminal of the controller 160. The PI terminal of the controller 160 is at either the H level or the L level.

An example is described as to the output level of the PO terminal of the controller 260 in which the output level is at the L level until t21, at the H level from t21 to t24, and at the L level from t24. In data transmission from the communication device 200 to the communication device 100, the output level of the PO terminal of the controller 160 remains at the L level so that the controller 260 can control the conductive/non-conductive state of the transmission path.

Until t21, the L-level signal is output from the PO terminal of the controller 260, and thus secondary-side current stops flowing in the phototransistor 232. Thus the base current of the PNP transistor 221 flows from the communication line 520 via the resistance 223 to the reference line 530. Accordingly, the PNP transistor 221 is in the ON state and the communication current flows through the communication line 520.

The communication current flows in the light-emitting diode 151 until t21, and thus the secondary-side current flows along the current path of the phototransistor 152. This causes the secondary-side current to flow from the power source terminal 144 via the resistance 143 and the phototransistor 152 to the ground terminal 146. Thus not enough base current flows in the NPN transistor 141 and the NPN transistor 141 is in the OFF state. This causes the PI terminal of the controller 160 to be at the H level. In this manner, until t21, the L-level signal output from the PO terminal of the controller 260 is supplied as the H-level signal to the PI terminal of the controller 160.

At t21, the output level of the PO terminal of the controller 260 is at the H level, and thus the primary-side current flows via the resistance 224 to the light-emitting diode 231. However, the time Ton from when the primary-side current flows in the light-emitting diode 231 to when the secondary-side current flows in the phototransistor 232 is required. At a point of time t21, therefore, no secondary-side current flows along the current path of the phototransistor 232 and the phototransistor 232 remains in the OFF state.

At t22 at which the time Ton has elapsed from t21, the phototransistor 232 is turned on and the secondary-side current flows in the phototransistor 232. At t22, this prevents enough base current from flowing in the PNP transistor 221 and then the PNP transistor 221 transitions to the OFF state. That is, when the time t22 arrives, communication current substantially stops flowing through the communication line 520.

In addition, at t22, communication current stops flowing in the light-emitting diode 151. However, the time Toff from when communication current stops flowing in the light-emitting diode 151 to when secondary-side current stops flowing in the phototransistor 152 is required. At a point of time t22, therefore, the phototransistor 152 remains in the ON state. Thus the NPN transistor 141 remains in the OFF state and the PI terminal of the controller 160 is at the H level.

At t22 at which the time Toff has elapsed from t23, secondary-side current stops flowing in the phototransistor 152 and thus the phototransistor 152 transitions to the OFF state. Accordingly, at t23, the base current of the NPN transistor 141 flows from the power source terminal 144 via the resistance 143 to the ground terminal 145, and then the NPN transistor 141 is turned on. That is, the H-level signal output from the PO terminal of the controller 260 at t21 is supplied as the L-level signal to the PI terminal of the controller 160 at t23. As such, the delay time taken from when the PO terminal of the controller 260 transitions from the L level to the H level to when the PI terminal of the controller 160 transitions from the H level to the L level is Ton+Toff.

Then at t24, the output level of the PO terminal of the controller 260 transitions to the L level and thus primary-side current stop flowing in the light-emitting diode 231. However, the time Toff from when primary-side current stop flowing in the light-emitting diode 231 to when secondary-side current stop flowing in the phototransistor 232 is required. At a point of time t24, therefore, the secondary-side current still flows in the phototransistor 232 and the phototransistor 232 remains in the ON state.

At t25 at which the time Toff has elapsed from t24, secondary-side current stops flowing along the current path of the phototransistor 232 and thus the phototransistor 232 is turned off. Thus at t25, the base current of the PNP transistor 221 flows from the communication line 520 via the resistance 223 to the reference line 530. Accordingly, the PNP transistor 221 is in the ON state and the communication current flows through the communication line 520.

At t25, the communication current flows in the light-emitting diode 151. However, the time Ton from when the communication current flows in the light-emitting diode 151 to when the secondary-side current flows in the phototransistor 152 is required. At a point of time t25, therefore, the secondary-side current still flows in the phototransistor 152 and the phototransistor 152 remains in the OFF state. At a point of time t25, therefore, the NPN transistor 141 remains in the ON state and the L-level signal is supplied to the PI terminal of the controller 160.

At t26 at which the time Ton has elapsed from t25, the secondary-side current flows in the phototransistor 152 and thus the phototransistor 152 is turned on. Thus at t26, the PI terminal of the controller 160 transitions to the H level. As such, the delay time taken from when the PO terminal of the controller 260 transitions from the H level to the L level to when the PI terminal of the controller 160 transitions from the H level to the L level is Toff+Ton.

As described above, in either way of data transmission, a rise delay time and a fall delay time is Ton+Toff. Similarly to the communication between the communication device 100 and the communication device 200, improvement in communication speed is also expected to the communication between the communication device 100 and the communication device 300, and the communication between the communication device 100 and the communication device 400.

In the present embodiment, each of the transmission circuit 120, the reception circuit 140, the transmission circuit 220, and the reception circuit 240 is a switching circuit that includes a combination of the photocoupler and the transistor. Thus a reduced switching time period of the switching circuit is expected. This is because the switching circuit that includes the combination of the photocoupler and the transistor has the reduced turn-on time and the reduced turn-off time compared with the switching circuit that includes a photocoupler alone. The reasons are described hereinafter by way of example of the reception circuit 140.

Figure 4A:
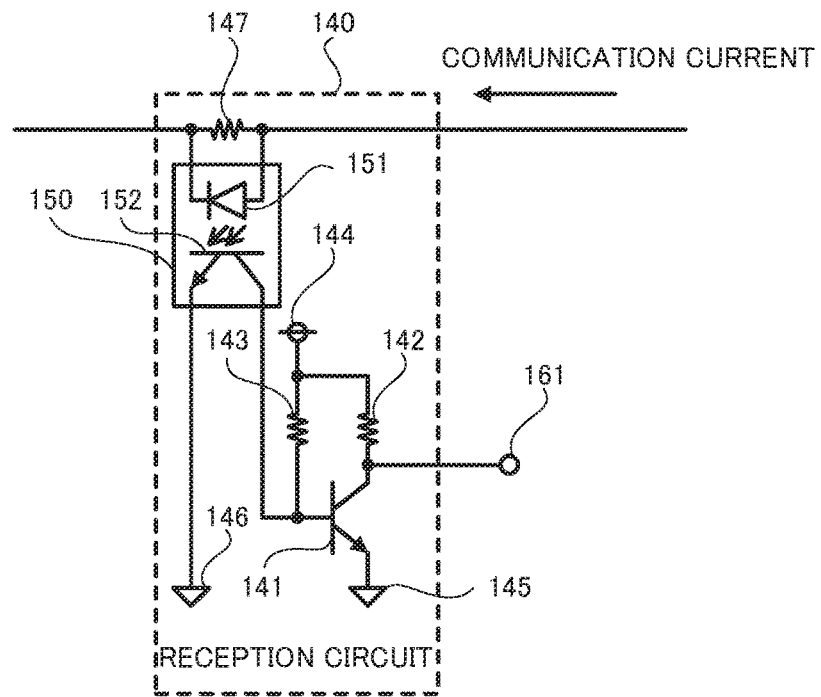
FIG. 4A is a configuration diagram of a reception circuit 140.

FIG. 4A is a circuit diagram of the reception circuit 140. The reception circuit 140 is a switching circuit that includes a combination of the photocoupler and the transistor. As described above, the reception circuit 140 includes the photocoupler 150, the NPN transistor 141, the resistance 142, the resistance 143, the power source terminal 144, the ground terminal 145, the ground terminal 146, and the resistance 147. Here, an output terminal 161 is a terminal connected to the emitter of the NPN transistor 141 included in the reception circuit 140. As illustrated in FIG. 4A, the resistance 143 functions as a base resistance of the NPN transistor 141 and also as a load resistance of the phototransistor 152. That is, in the reception circuit 140, the base resistance of the NPN transistor 141 is shared with the load resistance of the phototransistor 152.

Figure 4B:
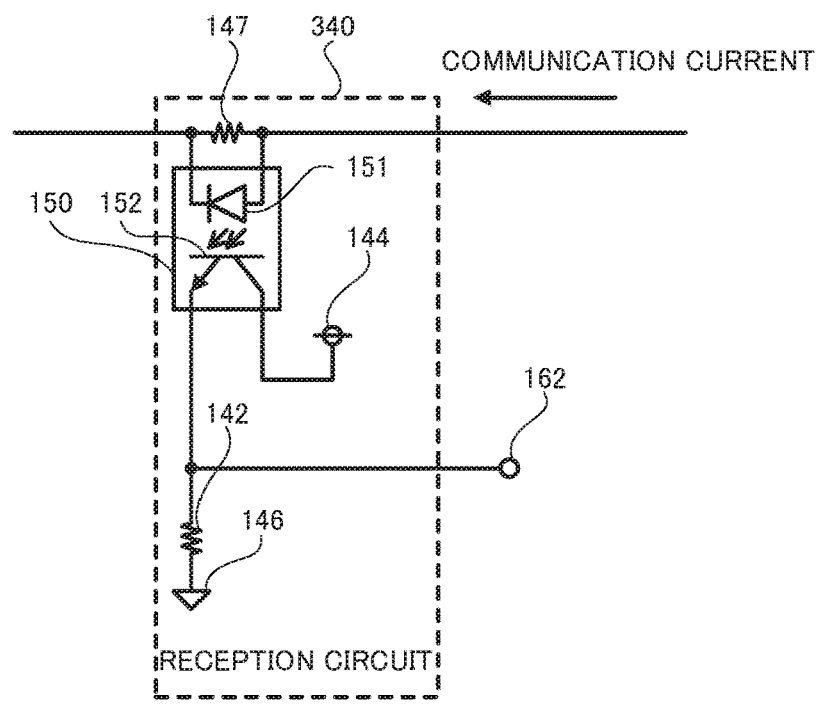
FIG. 4B is a configuration diagram of a reception circuit 340.

FIG. 4B is a circuit diagram of the reception circuit 340. The reception circuit 340 is a switching circuit that includes the photocoupler alone. The reception circuit 340 includes the photocoupler 150, the resistance 142, the power source terminal 144, the ground terminal 146, and the resistance 147. The emitter of the phototransistor 152 of the photocoupler 150 is connected to one end of the resistance 142 and an output terminal 162. The collector of the phototransistor 152 of the photocoupler 150 is connected to the power source terminal 144. The other end of the resistance 142 is connected to the ground terminal 146. Here, the output terminal 162 is a terminal connected to the emitter of the phototransistor 152 of the photocoupler 150 included in the reception circuit 340.

FIG. 5 is a timing chart illustrating timing of state transition of the light-emitting diode 151 and timing of level transition for each output terminal. Section (A) of FIG. 5 is a timing chart illustrating timing of state transition of the light-emitting diode 151. Section (B) of FIG. 5 is a timing chart illustrating timing of level transition of the output terminal 162. Section (C) of FIG. 5 is a timing chart illustrating timing of level transition of the output terminal 161. Here, as illustrated in Section (A) of FIG. 5, the light-emitting diode 151 is in the OFF state until t31, in the ON state from t31 to t34, and in the OFF state from t34. In this case, as illustrated in Section (B) of FIG. 5, the level of the output terminal 162 is at the L level until t31, increases from t31 to t32 at which Ton1 has elapsed from t31, and becomes the H level at t32. The level of the output terminal 162 remains at the H level from t34 to t35 at which Ts has elapsed from t34, decreases from t35 to t37 at which Toff1 has elapsed from t35, and becomes the L level at t37.

Here, Ton1 is the turn-on time of the photocoupler 150. Toff1 is the turn-off time of the photocoupler 150, which is a sum of Ts and Tf1. Ts is a storage time of the photocoupler 150 and Tf1 is a fall time of the photocoupler 150. As such, the turn-on time of the reception circuit 340 is Ton1 and the turn-off time of the reception circuit 340 is Toff1.

On the other hand, as illustrated in Section (C) of FIG. 5, the level of the output terminal 161 remains in the L level from t31 to t32 at which Ton2 has elapsed from t31, increases from t32 to t33 at which Toff3 has elapsed from t32, and becomes the H level at t33. The level of the output terminal 161 remains at the H level from t34 to t35 at which Ts has elapsed from t34, decreases from t35 to t36 at which Ton3 has elapsed from t35, and becomes the L level at t36.

Here, Toff3 is the turn-off time of the NPN transistor 141. Ton3 is the turn-on time of the NPN transistor 141. Ton2, which is the turn-on time of the reception circuit 140, is a sum of Ton1 and Toff3. Toff2, which is the turn-off time of the reception circuit 140, is a sum of Ts and Ton3. Such a length of time occurs because a decrease in current flowing through the phototransistor 152 initiates a flow of the base current through the NPN transistor 141, and when the value of the base current exceeds a predetermined value, the NPN transistor 141 is turned on.

Here, the switching time period of the NPN transistor 141 is sufficiently shorter than the switching time period of the photocoupler 150. Specifically, Toff3 and Ton3 are sufficiently shorter than Ton1 and Toff1 (Ts and Tf1). Thus the resistance values of the resistance 142 and the resistance 143 can be designed to cause enough base current to flow in the NPN transistor 141, thereby reducing the turn-off time of the reception circuit 140 compared with the turn-off time of the reception circuit 340 (turn-off time of the photocoupler 150). As such, the base resistance of the NPN transistor 141 is shared with the load resistance of the phototransistor 152, thereby reducing the switching time period of the reception circuit 140.

The reasons why the switching time period of the reception circuit 140 is shorter than the switching time period of the photocoupler 150 alone is briefly described above. Similarly, the switching time period of the reception circuit 240 is shorter than the switching time period of the photocoupler 250 alone. In addition, the switching time period of the transmission circuit 120 is shorter than the switching time period of the photocoupler 130 alone. Furthermore, the switching time period of the transmission circuit 220 is shorter than the switching time period of the photocoupler 230 alone. As such, the operation of the transistor in combination with the photocoupler contributes to reduction in the switching time period during which the photocoupler transitions from the ON state to the OFF state.

In contrast, the operation of the transistor combined with the photocoupler causes an increased switching time period during which the photocoupler transitions from the OFF state to the ON state. Nevertheless, the switching time period during which the photocoupler transitions from the OFF state to the ON state is basically shorter than the switching time period during which the photocoupler transitions from the ON state to the OFF state, and thus the switching time period can be reduced in total.

The delay time from when the communication device 100 transmits a signal to when the communication device 200 receives the signal is substantially equal to a sum of the switching time period of the transmission circuit 120 and the switching time period of the reception circuit 240. Reduction in this delay time helps reduce distortions of signals received by the communication device 200. Similarly, the delay time from when the communication device 200 transmits a signal to when the communication device 100 receives the signal is substantially equal to the switching time period of the transmission circuit 220 and the switching time period of the reception circuit 140. Reduction in this delay time helps reduce distortions of signals received by the communication device 100.

In the present embodiment, the photocoupler 250 used for data reception is included in the transmission path, and the photocoupler 130 used for data transmission is in a conductive/non-conductive state opposite to the photocoupler 250 used for data reception. Accordingly, when the photocoupler 130 used for data transmission transitions from the ON state to the OFF state, the photocoupler 250 used for data reception transitions from the OFF state to the ON state. When the photocoupler 130 used for data transmission transitions from the OFF state to the ON state, the photocoupler 250 used for data reception transitions from the ON state to the OFF state.

As such, the transitions from the OFF state to the ON state do not simultaneously occur in the photocoupler 130 used for data transmission and the photocoupler 250 used for data reception. That is, in the present embodiment, in a single data transmission from the communication device 100 to the communication device 200, a fall operation having a relatively longer switching time period is not executed for both the photocoupler 130 used for data transmission and the photocoupler 250 used for data reception. Thus, the present embodiment enables reduction of distortions of received signals and enables high-speed serial communication using photocouplers.

In the present embodiment, the transmission circuit 120 includes the photocoupler 130 combined with the PNP transistor 121. Then, in the transmission circuit 120, the resistance 124 serves as a base resistance of the PNP transistor 121 and also as a load resistance of the phototransistor 132. Thus, according to the present embodiment, a reduced switching time period of the transmission circuit 120 is expected.

In the present embodiment, the reception circuit 240 includes the photocoupler 250 combined with the NPN transistor 241. Then, in the reception circuit 240, the resistance 243 serves as a base resistance of the NPN transistor 241 and also as a load resistance of the phototransistor 252. Thus, according to the present embodiment, a reduced switching time period of the reception circuit 240 is expected.

In the present embodiment, the photocoupler 150 used for data reception is included in the transmission path, and the photocoupler 230 used for data transmission is in a conductive/non-conductive state opposite to the photocoupler 150 used for data reception. Accordingly, when the photocoupler 230 used for data transmission transitions from the ON state to the OFF state, the photocoupler 150 used for data reception transitions from the OFF state to the ON state. When the photocoupler 230 used for data transmission transitions from the OFF state to the ON state, the photocoupler 150 used for data reception transitions from the ON state to the OFF state.

As such, the transitions from the OFF state to the ON state do not simultaneously occur in the photocoupler 230 used for data transmission and the photocoupler 150 used for data reception. That is, in the present embodiment, in a single data transmission from the communication device 200 to the communication device 100, a fall operation having a relatively longer switching time period is not executed for both the photocoupler 230 used for data transmission and the photocoupler 150 used for data reception. Thus, the present embodiment enables reduction of distortions of received signals and enables high-speed serial communication using photocouplers.

In the present embodiment, the transmission circuit 220 includes the photocoupler 230 combined with the PNP transistor 221. Then, in the transmission circuit 220, the resistance 223 serves as a base resistance of the PNP transistor 221 and also as a load resistance of the phototransistor 232. Thus, according to the present embodiment, a reduced switching time period of the transmission circuit 220 is expected.

In the present embodiment, the reception circuit 140 includes the photocoupler 150 combined with the NPN transistor 141. Then, in the reception circuit 140, the resistance 143 serves as a base resistance of the NPN transistor 141 and also as a load resistance of the phototransistor 152. Thus, according to the present embodiment, a reduced switching time period of the reception circuit 140 is expected.

Variations

Although embodiments of the present disclosure are described above, modifications and adaptations in accordance with various aspects are possible in the practice of the present disclosure.

The present disclosure includes any possible selection of configurations, functions, or operations as described in the above embodiments. The present disclosure also includes additional configurations, functions, and operations in addition to the above described configurations, functions, and operations. In addition, the configurations, functions, and operations as described in the above embodiments can be freely combined.

The above embodiments exemplify the transmission circuit 120 and the transmission circuit 220 that both have reverse functions for the conductive/non-conductive state. However, the present disclosure includes an implementation in which at least one of the transmission circuit 120 or the transmission circuit 220 has a reverse function for the conductive/non-conductive state. For example, the communication device 100 can include, instead of the transmission circuit 120, a transmission circuit in which the photocoupler 130 is included in the transmission path. Alternatively, the communication device 200 can include, instead of the transmission circuit 220, a transmission circuit in which the photocoupler 230 is included in the transmission path.

The above embodiments exemplify the reception circuit 140 including the resistance 147, which is a threshold resistance. However, inclusion of the resistance 147 in the reception circuit 140 is optional in the present disclosure. In this case, for example, the resistance value of the resistance 223 is set to be much greater than the resistance value of the resistance 222 so that the photocoupler 150 is in the OFF state while the photocoupler 230 is in the ON state.

The above embodiments exemplify application of the present disclosure to a communication system capable of two-way communications among communication devices. Alternatively, the present disclosure can be applied to a communication system capable of one-way communication between communication devices. For example, the present disclosure can be applied to a communication system that includes a transmission device excluding the reception circuit 140 from the communication device 100, and a reception device excluding the transmission circuit 220 from the communication device 200. Such communication systems enable high-speed serial communication from the transmission device to the reception device. Examples of such communication systems include a communication system including a monitoring device and monitored device, and a communication system including a control device and a controlled device.

The above embodiments exemplify the communication system 1000 as an air conditioning system, that is, an implementation in which the communication device 100 is an outdoor unit and the communication device 200 is an indoor unit. The system to which the present disclosure is applied is not limited to the air conditioning system. The present disclosure can be applied to a communication system including communication devices that are mutually connected through the communication lines 520 and the reference lines 530 and are configured for communication by serial communication via the communication lines 520 and the reference lines 530. For example, the present disclosure can be applied to an illumination system including an illumination control device and an illumination device.

The above embodiments exemplify the photocoupler 130, the photocoupler 150, the photocoupler 230, and the photocoupler 250, all having the same properties. The photocouplers according to the present disclosure may have different properties. For example, the photocoupler 130 and the photocoupler 230 may be a photocoupler without high-voltage tolerance because the photocouplers are not located on the path to which a high voltage may be applied due to miswiring. However, the photocoupler 150 and the photocoupler 250 are high-voltage tolerance because the photocouplers are located on the path to which a high voltage may be applied due to miswiring. In this case, for example, it is advantageous that the photocoupler 130 and the photocoupler 230 are photocouplers without high-voltage tolerance, which has a relatively high-speed switching speed, and the photocoupler 150 and the photocoupler 250 are high-voltage tolerance having a relatively low-speed switching speed. Such configuration provides reduction of the delay time that is a sum of the switching time period of the photocoupler used for data transmission and the switching time period of the photocoupler used for data reception, which enables higher-speed serial communication.

The above embodiments exemplify uses of the PNP transistor 121, the PNP transistor 122, the PNP transistor 221, the NPN transistor 141, and the NPN transistor 241. The present disclosure can use, instead of these transistors, various switching elements having a higher switching speed than the photocouplers. For example, a P-type Metal Oxide Semiconductor Field Effect Transistor (MOSFET) can be used instead of each of the PNP transistor 121, the PNP transistor 122, and the PNP transistor 221, and N-type MOSFET can be used instead of each of the NPN transistor 141 and the NPN transistor 241.

The above embodiments describe a configuration in which the communication device 100 includes a DC power source 110 and receives supply of power from the AC power source 600. The present disclosure includes a configuration in which the communication device 200 includes the DC power source 110 and receives supply of power from the AC power source 600.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The present disclosure is applicable to a communication system for communication by serial communication using photocouplers.

The invention claimed is:

1. A communication system comprising a first communication circuit and a second communication circuit that are configured to perform serial communication with each other,
one circuit of the first communication circuit and the second communication circuit including a direct-current power source, an other circuit of the first communication circuit and the second communication circuit not including the direct-current power source,
the first communication circuit and the second communication circuit being connected to each other
via a communication line that allows electric current supplied from the direct-current power source to flow therethrough from the one circuit to the other circuit and
via a reference line that allows the electric current passed through the communication line to flow therethrough from the other circuit to the one circuit, wherein:
the first communication circuit comprises:
a first transmission circuit comprising a first transmission photocoupler, a conductive or non-conductive state of the first transmission photocoupler being controlled in accordance with data to be transmitted to the second communication circuit, the first transmission circuit being configured to control a conductive or non-conductive state of a transmission path including the communication line and the reference line in accordance with the conductive or non-conductive state of the first transmission photocoupler; and
a first reception circuit comprising a first reception photocoupler, a conductive or non-conductive state of the first reception photocoupler being controlled in accordance with the conductive or non-conductive state of the transmission path, the first reception circuit being configured to detect the conductive or non-conductive state of the first reception photocoupler, thereby receiving data transmitted by the second communication circuit,
the second communication circuit comprises:
a second transmission circuit comprising a second transmission photocoupler, a conductive or non-conductive state of the second transmission photocoupler being controlled in accordance with data to be transmitted to the first communication circuit, the second transmission circuit being configured to control the conductive or non-conductive state of the transmission path in accordance with the conductive or non-conductive state of the second transmission photocoupler; and
a second reception circuit comprising a second reception photocoupler, a conductive or non-conductive state of the second reception photocoupler being controlled in accordance with the conductive or non-conductive state of the transmission path, the second reception circuit being configured to detect the conductive or non-conductive state of the second reception photocoupler, thereby receiving data transmitted by the first communication circuit,
the second reception photocoupler is included in the transmission path,
the conductive or non-conductive state of the first transmission photocoupler is opposite to the conductive or non-conductive state of the second reception photocoupler,
the first transmission circuit further comprises a first positive-negative-positive (PNP) transistor including a current path included in the transmission path, and a first resistance including one end connected to a base of the first PNP transistor and another end connected to the reference line,
the first transmission photocoupler includes a collector connected to an emitter of the first PNP transistor, and
the first transmission photocoupler includes an emitter connected to the base of the first PNP transistor.

2. A communication system comprising a first communication circuit and a second communication circuit that are configured to perform serial communication with each other,
one circuit of the first communication circuit and the second communication circuit including a direct-current power source, an other circuit of the first communication circuit and the second communication circuit not including the direct-current power source,
the first communication circuit and the second communication circuit being connected to each other
via a communication line that allows electric current supplied from the direct-current power source to flow therethrough from the one circuit to the other circuit and
via a reference line that allows the electric current passed through the communication line to flow therethrough from the other circuit to the one circuit, wherein:
the first communication circuit comprises:
a first transmission circuit comprising a first transmission photocoupler, a conductive or non-conductive state of the first transmission photocoupler being controlled in accordance with data to be transmitted to the second communication circuit, the first transmission circuit being configured to control a conductive or non-conductive state of a transmission path including the communication line and the reference line in accordance with the conductive or non-conductive state of the first transmission photocoupler; and
a first reception circuit comprising a first reception photocoupler, a conductive or non-conductive state of the first reception photocoupler being controlled in accordance with the conductive or non-conductive state of the transmission path, the first reception circuit being configured to detect the conductive or non-conductive state of the first reception photocoupler, thereby receiving data transmitted by the second communication circuit, the second communication circuit comprises:
a second transmission circuit comprising a second transmission photocoupler, a conductive or non-conductive state of the second transmission photocoupler being controlled in accordance with data to be transmitted to the first communication circuit, the second transmission circuit being configured to control the conductive or non-conductive state of the transmission path in accordance with the conductive or non-conductive state of the second transmission photocoupler; and
a second reception circuit comprising a second reception photocoupler, a conductive or non-conductive state of the second reception photocoupler being controlled in accordance with the conductive or non-conductive state of the transmission path, the second reception circuit being configured to detect the conductive or non-conductive state of the second reception photocoupler, thereby receiving data transmitted by the first communication circuit, the second reception photocoupler is included in the transmission path, the conductive or non-conductive state of the first transmission photocoupler is opposite to the conductive or non-conductive state of the second reception photocoupler, the second reception circuit further comprises a first negative-positive-negative (NPN) transistor, a second resistance including one end connected to a collector of the first NPN transistor and another end connected to a first power source terminal, and a third resistance including one end connected to a base of the first NPN transistor and another end connected to the first power source terminal, the second reception photocoupler includes a collector connected to the base of the first NPN transistor, and the second reception photocoupler includes an emitter connected to a first ground terminal and to an emitter of the first NPN transistor.

3. A communication system comprising a first communication circuit and a second communication circuit that are configured to perform serial communication with each other,
one circuit of the first communication circuit and the second communication circuit including a direct-current power source, an other circuit of the first communication circuit and the second communication circuit not including the direct-current power source,
the first communication circuit and the second communication circuit being connected to each other
via a communication line that allows electric current supplied from the direct-current power source to flow therethrough from the one circuit to the other circuit and
via a reference line that allows the electric current passed through the communication line to flow therethrough from the other circuit to the one circuit, wherein:

the first communication circuit comprises:
a first transmission circuit comprising a first transmission photocoupler, a conductive or non-conductive state of the first transmission photocoupler being controlled in accordance with data to be transmitted to the second communication circuit, the first transmission circuit being configured to control a conductive or non-conductive state of a transmission path including the communication line and the reference line in accordance with the conductive or non-conductive state of the first transmission photocoupler; and
a first reception circuit comprising a first reception photocoupler, a conductive or non-conductive state of the first reception photocoupler being controlled in accordance with the conductive or non-conductive state of the transmission path, the first reception circuit being configured to detect the conductive or non-conductive state of the first reception photocoupler, thereby receiving data transmitted by the second communication circuit, the second communication circuit comprises:
a second transmission circuit comprising a second transmission photocoupler, a conductive or non-conductive state of the second transmission photocoupler being controlled in accordance with data to be transmitted to the first communication circuit, the second transmission circuit being configured to control the conductive or non-conductive state of the transmission path in accordance with the conductive or non-conductive state of the second transmission photocoupler; and
a second reception circuit comprising a second reception photocoupler, a conductive or non-conductive state of the second reception photocoupler being controlled in accordance with the conductive or non-conductive state of the transmission path, the second reception circuit being configured to detect the conductive or non-conductive state of the second reception photocoupler, thereby receiving data transmitted by the first communication circuit, the second reception photocoupler is included in the transmission path, the conductive or non-conductive state of the first transmission photocoupler is opposite to the conductive or non-conductive state of the second reception photocoupler, the first reception photocoupler is included in the transmission path, and the conductive or non-conductive state of the second transmission photocoupler is opposite to the conductive or non-conductive state of the first reception photocoupler.

4. The communication system according to claim 3, wherein
the second transmission circuit further comprises a second positive-negative-positive (PNP) transistor including a current path included in the transmission path, and a fourth resistance including one end connected to a base of the second PNP transistor and another end connected to the reference line,
the second transmission photocoupler includes a collector connected to an emitter of the second PNP transistor, and
the second transmission photocoupler includes an emitter connected to the base of the second PNP transistor.

5. The communication system according to claim 3, wherein
the first reception circuit further comprises a second negative-positive-negative (NPN) transistor, a fifth resistance including one end connected to a collector of the second NPN transistor and another end connected to a second power source terminal, and a sixth resistance including one end connected to a base of the second NPN transistor and another end connected to the second power source terminal, the first reception photocoupler includes a collector connected to the base of the second NPN transistor, and the first reception photocoupler includes an emitter connected to a second ground terminal and to an emitter of the second NPN transistor.

6. The communication system according to claim 3, wherein the second transmission circuit comprises a second switching element having a current path provided on the transmission path, the second switching element switching the conductive or non-conductive state of the transmission path to a conductive or non-conductive state that is opposite to the conductive or non-conductive state of the second transmission photocoupler.

7. A transmission circuit for data transmission by control of a conductive or non-conductive state of a transmission path including a communication line and a reference line, the transmission circuit being connected via the communication line and the reference line to a reception circuit comprising a reception photocoupler, a conductive or non-conductive state of the reception photocoupler being controlled in accordance with the conductive or non-conductive state of the transmission path, the reception circuit being configured to receive data by detection of the conductive or non-conductive state of the reception photocoupler, one circuit of the transmission circuit and the reception circuit including a direct-current power source for supply of electric current on the transmission path, an other circuit of the transmission circuit and the reception circuit not including the direct-current power source, the electric current, supplied by the direct-current power source, flowing from the one circuit via the communication line to the other circuit and flowing from the other circuit via the reference line to the one circuit, the transmission circuit comprising:

a transmitting circuit comprising a transmission photocoupler, a conductive or non-conductive state of the transmission photocoupler being controlled in accordance with data to be transmitted to the reception circuit, the transmitting circuit being configured to control the conductive or non-conductive state of the transmission path in accordance with the conductive or non-conductive state of the transmission photocoupler, wherein:

the reception photocoupler is included in the transmission path, the conductive or non-conductive state of the transmission photocoupler is opposite to the conductive or non-conductive state of the reception photocoupler, the transmission circuit further comprises a first positive-negative-positive (PNP) transistor including a current path included in the transmission path, and a first resistance including one end connected to a base of the first PNP transistor and another end connected to the reference line, the transmission photocoupler includes a collector connected to an emitter of the first PNP transistor, and the transmission photocoupler includes an emitter connected to the base of the first PNP transistor.

8. A communication system comprising a first communication circuit and a second communication circuit that are configured to perform serial communication with each other, one circuit of the first communication circuit and the second communication circuit including a direct-current power source, an other circuit of the first communication circuit and the second communication circuit not including the direct-current power source, the first communication circuit and the second communication circuit being connected to each other via a communication line that allows electric current supplied from the direct-current power source to flow therethrough from the one circuit to the other circuit and via a reference line that allows the electric current passed through the communication line to flow therethrough from the other circuit to the one circuit, wherein:

the first communication circuit comprises:

a first transmission circuit comprising a first transmission photocoupler, a conductive or non-conductive state of the first transmission photocoupler being controlled in accordance with data to be transmitted to the second communication circuit, the first transmission circuit being configured to control a conductive or non-conductive state of a transmission path including the communication line and the reference line in accordance with the conductive or non-conductive state of the first transmission photocoupler; and a first reception circuit comprising a first reception photocoupler, a conductive or non-conductive state of the first reception photocoupler being controlled in accordance with the conductive or non-conductive state of the transmission path, the first reception circuit being configured to detect the conductive or non-conductive state of the first reception photocoupler, thereby receiving data transmitted by the second communication circuit, the second communication circuit comprises:

a second transmission circuit comprising a second transmission photocoupler, a conductive or non-conductive state of the second transmission photocoupler being controlled in accordance with data to be transmitted to the first communication circuit, the second transmission circuit being configured to control the conductive or non-conductive state of the transmission path in accordance with the conductive or non-conductive state of the second transmission photocoupler; and a second reception circuit comprising a second reception photocoupler, a conductive or non-conductive state of the second reception photocoupler being controlled in accordance with the conductive or non-conductive state of the transmission path, the second reception circuit being configured to detect the conductive or non-conductive state of the second reception photocoupler, thereby receiving data transmitted by the first communication circuit, the second reception photocoupler is included in the transmission path, the conductive or non-conductive state of the first transmission photocoupler is opposite to the conductive or non-conductive state of the second reception photocoupler, and the first transmission circuit comprises a first switching element having a current path provided on the transmission path, the first switching element switching the conductive or non-conductive state of the transmission path to a conductive or non-conductive state that is opposite to the conductive or non-conductive state of the first transmission photocoupler.

9. A transmission circuit for data transmission by control of conductive or non-conductive state of a transmission path including a communication line and a reference line, the transmission circuit being connected via the communication line and the reference line to a reception circuit comprising a reception photocoupler, a conductive or non-conductive state of the reception photocoupler being controlled in accordance with the conductive or non-conductive state of the transmission path, the reception circuit being configured to receive data by detection of the conductive or non-conductive state of the reception photocoupler, one circuit of the transmission circuit and the reception circuit including a direct-current power source for supply of electric current on the transmission path, an other circuit of the transmission circuit and the reception circuit not including the direct-current power source, the electric current, supplied by the direct-current power source, flowing from the one circuit via the communication line to the other circuit and flowing from the other circuit via the reference line to the one circuit, the transmission circuit comprising:

a transmitting circuit comprising a transmission photocoupler, a conductive or non-conductive state of the transmission photocoupler being controlled in accordance with data to be transmitted to the reception circuit, the transmitting circuit being configured to control the conductive or non-conductive state of the transmission path in accordance with the conductive or non-conductive state of the transmission photocoupler, wherein:

the reception photocoupler is included in the transmission path, the conductive or non-conductive state of the transmission photocoupler is opposite to the conductive or non-conductive state of the reception photocoupler, and the transmission circuit comprises a switching element having a current path provided on the transmission path, the switching element switching the conductive or non-conductive state of the transmission path to a conductive or non-conductive state that is opposite to the conductive or non-conductive state of the transmission photocoupler.

\* \* \* \* \*